United States Patent
Dale (10) Patent No.: US 7,155,174 B2
(45) Date of Patent: Dec. 26, 2006

(54) METHOD AND APPARATUS FOR COMPENSATING FOR FREQUENCY OFFSETS CAUSED BY A FREE-RUNNING OSCILLATOR

(75) Inventor: Mark Dale, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 1191 days.

(21) Appl. No.: 09/978,719

(22) Filed: Oct. 18, 2001

(65) Prior Publication Data

US 2003/0078021 A1   Apr. 24, 2003

(51) Int. Cl.
   *H04B 1/38*   (2006.01)
(52) U.S. Cl. .......................... 455/73; 455/259; 455/75; 455/209; 455/255
(58) Field of Classification Search ............... 455/75, 455/258, 69, 114.2, 115.1, 126, 76; 375/344, 375/306, 307, 219
See application file for complete search history.

(56) References Cited

U.S. PATENT DOCUMENTS 6,603,958 B1*  8/2003  Gao et al. ................... 455/63.1
6,765,879 B1*  7/2004  Yamamoto et al. .......... 370/252

FOREIGN PATENT DOCUMENTS

| EP | 0 684 708 | 11/1995 |
| EP | 0 726 662 | 8/1996 |
| EP | 0 969 636 | 1/2000 |
| GB | 2 347 285 | 8/2000 |

OTHER PUBLICATIONS

European Search Report, issued by the European Patent Office, dated Feb. 6, 2003.

* cited by examiner

*Primary Examiner*—Jean Gelin
*Assistant Examiner*—Nam Huynh
(74) *Attorney, Agent, or Firm*—Sterne, Kessler, Goldstein & Fox PLLC (57) ABSTRACT

A transceiver includes a Downstream Signal Processor (DSP), an Upstream Signal Processor (USP), a Local Oscillator (LO), a differencer, a reference signal generator, and an estimator. The DSP receives an initial downstream signal, a downstream LO signal from the LO, and from the estimator a frequency-offset estimate indicative of a free-running frequency offset included in the initial downstream signal. The DSP uses the LO signal and the estimate to frequency down-convert the initial downstream signal, and also to remove the frequency offset from the initial downstream signal, thereby producing a corrected downstream signal. The USP uses both an upstream LO signal from the LO and the estimate to frequency convert an initial upstream signal so as to produce a frequency pre-corrected upstream signal.

24 Claims, 5 Drawing Sheets

METHOD AND APPARATUS FOR COMPENSATING FOR FREQUENCY OFFSETS CAUSED BY A FREE-RUNNING OSCILLATOR

BACKGROUND OF THE INVENTION

1. Field of the Invention

The present invention relates generally to communication devices, and more particularly, to such a device capable of operating in conjunction with a free-running oscillator.

2. Related Art

A known communication system includes a basestation transmitter/receiver (referred to as a transceiver) and one or more subscriber transceivers remote from the basestation. The basestation transceiver transmits a downstream communication signal including useful information (such as audio, video, etc.) to the subscriber transceivers. Each subscriber transceiver includes a receiver to recover the useful information from the downstream signal. Typically, the receiver first recovers/extracts inherent timing and/or frequency information from the downstream signal, for example, by frequency synchronizing an oscillator in the receiver to the downstream signal. Then, the receiver uses the recovered timing and/or frequency information to recover the useful information conveyed by the downstream signal.

Similarly, the basestation may also need to be able to recover inherent timing and/or frequency information from the upstream signal transmitted by the subscriber transceiver. However, some basestations may be incapable of recovering such upstream timing and/or frequency information unless it is closely matched to the downstream frequency and/or timing information.

It is desirable to keep the subscriber transceiver complexity, and thus overall cost, as low as possible. One cost driver in the subscriber transceiver tends to be any high frequency oscillator for generating high frequency signals used in or in conjunction with the transceiver. For example, oscillators used to generate signals in the GigaHertz (GHz) frequency range tend to be expensive, and thus, drive-up the overall cost of the transceiver.

Therefore, there is a need for a transceiver capable of extracting timing and/or frequency information from a downstream signal.

There is a further need for a transceiver capable of generating an upstream signal including inherent frequency and/or timing information that is closely matched to the frequency and/or timing characteristics of a downstream signal received by the transceiver.

There is an even further need for a low cost transceiver. There is a related need to reduce the cost of a high frequency oscillator used in or in conjunction with the transceiver, as compared to known systems.

SUMMARY OF THE INVENTION

A transceiver of the present invention includes the feature of extracting timing and/or frequency information from a downstream signal by frequency synchronizing an oscillator in the transceiver to the downstream signal.

The transceiver of the present invention has the feature of generating an upstream signal including inherent frequency and/or timing information matched closely to the frequency and/or timing characteristics of the downstream signal received by the transceiver. The transceiver frequency synchronizes the upstream to the downstream signal.

The transceiver of the present invention can be used with a free-running high frequency oscillator to reduce the overall cost of the transceiver. The free-running oscillator is not synchronized (for example, phase-locked or frequency-locked) to any other stable, reference oscillators.

DETAILED DESCRIPTION OF THE INVENTION

Example Environment

Figure 1:
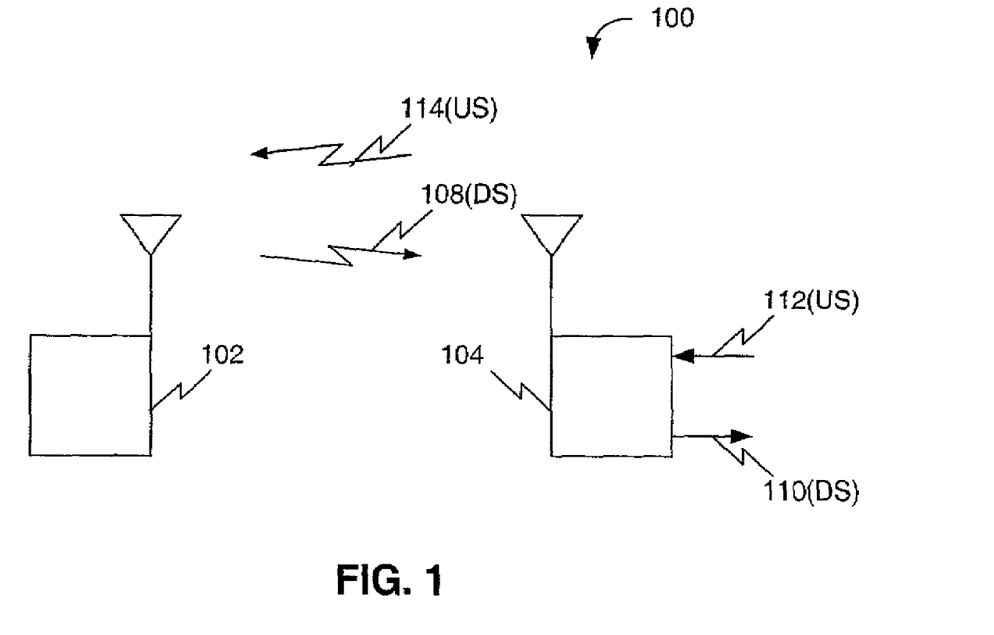
FIG. 1 is an example operating environment of the present invention.

FIG. 1 is an example operating environment 100 of the present invention. Environment 100 includes a transmitter/receiver (transceiver) device 102 and a transceiver device 104. In a downstream (DS) direction, transceiver device 102 transmits a downstream communication signal 108 (frequency $f_{RFd}$) to transceiver device 104. Downstream signal 108 may be, but is not limited to, a complex, broadband signal, including multiple carriers, such as an Orthogonal Frequency Division Multiplexed (OFDM) signal. Also, in some environments, downstream signal 108 may be encoded with a master timing signal, such as a series of time stamps. Transceiver device 104 receives downstream communication signal 108, and derives a corrected downstream signal 110 from the received downstream signal in accordance with the present invention. In an upstream (US) direction, transceiver device 104 receives an initial upstream signal 112 from an external source, not shown. Transceiver device 104 derives an upstream signal 114 (frequency $f_{RFu}$) from initial upstream signal 112 in accordance with the present invention, and transmits upstream signal 114 to transceiver 102.

Figure 2:
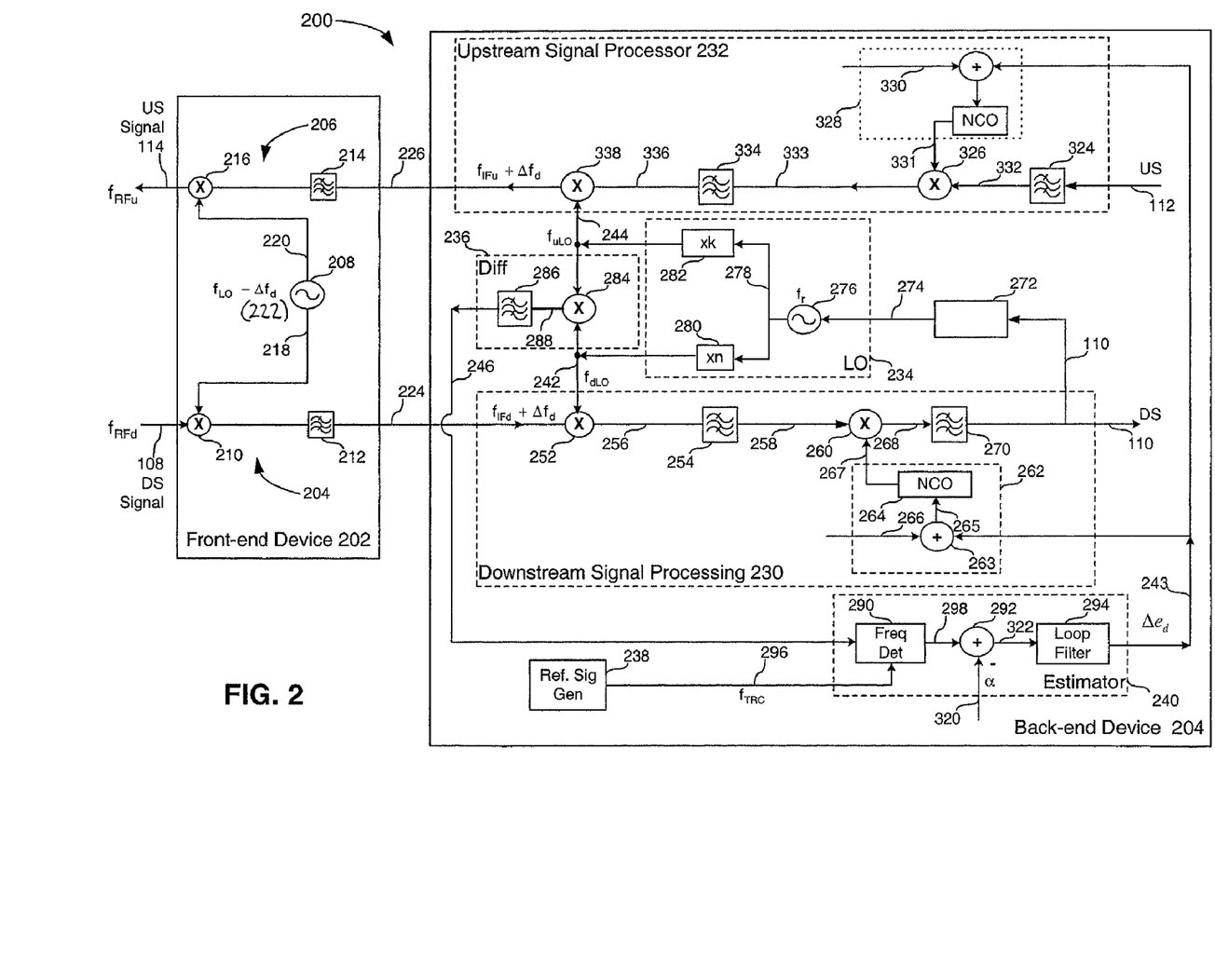
FIG. 2 is a block diagram of an example transceiver system from the environment of FIG. 1.

FIG. 2 is a block diagram of an example transceiver device 200 corresponding to transceiver device 104 described above. Transceiver device 200 includes a front-end transceiver device 202 coupled to a back-end transceiver device 204. Front-end device 202 and back-end device 204 need not be co-located with one another. That is, front-end device 202 may be separated from back-end device 204 by some distance. Also, signals may be carried between front-end and back-end devices 202 and 204 over known signal transmission media, such as coaxial cables. The present invention resides in back-end device 204, as will be described in further detail below.

Front-end Device

Front-end device 202 includes a downstream frequency-converter 204, an upstream frequency-converter 206, and a free-running oscillator 208. Downstream frequency-converter 204 includes a mixer 210 followed by a bandpass filter 212, and upstream-frequency converter 206 includes a bandpass filter 214 followed by a mixer 216. Free-running local oscillator 208 provides a free-running downstream LO signal 218 to mixer 210 and a free-running upstream LO signal 220 to mixer 216. LO signals 218 and 220 can be the same signal, and therefore, have the same frequency.

Free-running LO 208 is not synchronized (for example, phase-locked or frequency-locked) to a stable, accurate, external reference oscillator. Free-running LO 208 can be, for example, a relatively low cost, free-running, Dielectric Resonator Oscillator (DRO) for generating LO signals 218 and 220 in the GHz frequency range. A DRO generates a frequency that tends to drift noticeably over time, temperature, process and so on, when not synchronized to a stable reference oscillator. Thus, free-running LO signals 218 and 220 have respective frequencies tending to include an undesired frequency offset $\Delta f_d$ (also represented by reference numeral 222 in FIG. 2) from a predetermined, desired frequency $f_{LO}$ of the LO signals.

In the downstream direction, front-end device 202 receives downstream signal 108. Downstream frequency-converter 204 frequency-converts downstream signal 108 (frequency $f_{RFd}$) to an initial downstream signal 224 (frequency $f_{IFd}+\Delta f_d$) based on free-running LO signal 218 provided to mixer 210, whereby the free-running LO signal imparts the undesired frequency offset $\Delta f_d$ to the initial downstream signal 224. Front-end device 202 provides initial downstream signal 224 to back-end device 204.

In the upstream direction, back-end device 204 provides a pre-corrected upstream signal (frequency $f_{IFu}+\Delta f_d$) to upstream frequency-converter converter 206 of front-end device 202. Upstream frequency-converter 206 frequency-converts pre-corrected upstream signal 226 to upstream signal 114 based on free-running LO signal 220 provided to mixer 216.

Back-end Device

OVERVIEW

Back-end device 204 includes a Downstream Signal Processor (DSP) 230, an Upstream Signal Processor (USP) 232, a Local Oscillator (LO) 234, a differencer 236, a reference signal generator 238, and an estimator 240. DSP 230 receives initial downstream signal 224 from front-end device 202, a downstream LO signal 242 (frequency $f_{dLO}$) from LO 234, and from estimator 240 a frequency-offset estimate $\Delta e_d$ (identified as estimate signal 243 in FIG. 2) indicative of the free-running frequency off set $\Delta f_d$ included in initial downstream signal 224. DSP 230 uses LO signal 242 and estimate $\Delta e_d$ to frequency down-convert initial downstream signal 224, and also to remove undesired frequency offset $\Delta f_d$ from the initial downstream signal 224, thereby producing corrected downstream signal 110 at a baseband frequency.

Similarly, USP 232 receives initial upstream signal 112, an upstream LO signal 244 from LO 234, and the frequency-offset estimate $\Delta e_d$ from estimator 240. USP 232 uses LO signal 244 and estimate $\Delta e_d$ to frequency up-convert initial upstream signal 112, and also to frequency pre-correct the initial upstream signal by an amount equal to the estimate $\Delta e_d$, thereby producing pre-corrected upstream signal 226 at the pre-corrected Intermediate Frequency (IF) ($f_{IFu}+\Delta f_d$). USP 232 provides pre-corrected upstream signal 226 to upstream frequency-converter 206 of front-end device 202.

DSP 230 provides corrected downstream signal 110, or alternatively, a signal 274 derived from the downstream signal, as a control signal to LO 234. LO 234 generates downstream LO signal 242, and upstream LO signal 244 in response to the control signal. The control signal synchronizes (for example, frequency-locks) downstream and upstream LO signals 242 and 244 to initial downstream signal 224, and thus to downstream signal 108, to the extent corrected downstream signal 110 is free of the undesired frequency offset $\Delta f_d$ (that is, to the extent estimate $\Delta e_d$ represents frequency offset $\Delta f_d$).

Differencer 236 derives a difference signal 246 indicative of a portion of the undesired frequency offset $\Delta f_d$ corrupting corrected downstream signal 110, based on a difference in frequency between upstream and downstream LO signals 242 and 244. Estimator 240 receives difference signal 246, and one or more reference signals (described below), and derives estimate $\Delta e_d$ from the difference signal and the reference signals.

Detailed Operation

DOWNSTREAM SIGNAL PROCESSOR

DSP 230 includes a first mixer 252 followed by an IF bandpass filter 254. Mixer 252 frequency-converts initial downstream signal 224 (also referred to as first IF signal 224) to a second IF signal 256 based on LO signal 242. In doing so, mixer 252 translates the frequency offset $\Delta f_d$ included in first IF signal 224 to second IF signal 256. Filter 254 filters second IF signal 256 to produce a filtered second IF signal 258. Filter 254 provides second IF signal 258 (including frequency offset $\Delta f_d$) to a second mixer 260. In an alternative arrangement of the present invention, an analog-to-digital (A/D) converter, connected between filter 254 and second mixer 260, digitizes the signal output by filter 254. In this alternative arrangement, second IF signal 258 supplied to second mixer 260 is digitized.

DSP 230 includes a correction signal generator 262, having a combiner 263 coupled to a numerically controlled oscillator (NCO) 264. Combiner 263 derives a frequency control signal 265 based on frequency-offset estimate $\Delta e_d$ and a frequency reference signal 266. Frequency reference signal 266 represents a predetermined frequency offset necessary to frequency-translate IF signal 258 to baseband, in the absence of frequency-offset $\Delta f_d$. For example, if IF signal 258 has a nominal, predetermined IF frequency of 6 MegaHertz (MHz), then frequency reference signal 266 represents a frequency offset equal to 6 MHz.

In response to frequency-offset estimate $\Delta e_d$ and frequency reference signal 266, NCO 264 generates a downstream correction signal 267 having a frequency representative of frequency-offset estimate $\Delta e_d$. For example, in the arrangement depicted in FIG. 2, correction signal 267 has a frequency $f_c$ given by: frequency $f_c$=frequency-offset estimate $\Delta e_d$+the frequency indicated by frequency reference signal 266 (that is, the frequency necessary to translate IF signal 258 to baseband).

In the arrangement depicted in FIG. 2, frequency-offset estimate $\Delta e_d$, frequency control signal 265, and frequency reference signal 266 are numeric inputs representative of their respective frequencies. An alternative arrangement of correction signal generator 262 includes a Voltage Controlled Oscillator (VCO) instead of NCO 264. In such an alternative arrangement, signals $\Delta e_d$, 265, and 266 may be voltage or current based signals (instead of numeric signals) representative of their respective frequencies.

Mixer 260 frequency-converts second IF signal 258 to a baseband signal 268 based on downstream frequency correction signal 267. Mixer 260 removes from IF signal 258 a portion of the frequency offset $\Delta f_d$ represented by estimated $\Delta e_d$. That is, mixer 260 removes frequency offset $\Delta f_d$ from second IF signal 258 to the extent the frequency of downstream correction signal 267 represents frequency offset $\Delta f_d$. Thus, when estimate $\Delta e_d$ does not accurately represent frequency offset $\Delta f_d$, baseband signal 268 includes an undesired residual portion of the frequency offset $\Delta f_d$. Mixer 260 provides baseband signal 268 to a lowpass filter 270. Lowpass filter 270 filters signal 268 to produce corrected downstream signal 110, which may include the residual portion of frequency offset $\Delta f_d$ for the reason mentioned above.

Lowpass filter 270 provides corrected downstream signal 110 to an optional processor 272 to process corrected downstream signal 110. Processor 272 is used to process complex, baseband waveforms, such as a baseband OFDM signal, when downstream signal 110 includes such waveforms. Processor 272 derives an LO frequency control signal 274 from corrected downstream signal 110. Therefore, frequency control signal 274 is indicative of (for example, proportional to) the residual portion of frequency offset $\Delta f_d$ remaining in corrected downstream signal 110. Processor 272 provides the control signal to LO 234.

Alternative arrangements of DSP 230 are within the scope of the present invention. For example, first mixer 252 may operate as a frequency up-converter (instead of frequency down-converter) in one alternative arrangement. In another alternative arrangement, DSP 230 may include only a single mixer to frequency down-convert initial downstream signal 224 to a baseband frequency.

LOCAL OSCILLATOR

LO 234 includes a frequency tunable reference oscillator 276. Reference oscillator 276 generates a reference signal 278 (frequency $f_r$) responsive to control signal 274. When corrected downstream signal 110 is free of frequency offset $\Delta f_d$, control signal 274 causes oscillator 276 to generate reference signal 278 at a nominal predetermined frequency. On the other hand, when corrected downstream signal 278 includes a residual portion of frequency offset $\Delta f_d$, control signal 274 causes frequency $f_r$ to be frequency-shifted from the nominal predetermined frequency of reference signal 278 by an amount $\Psi \Delta f_d$ representative of the residual portion of frequency offset $\Delta f_d$, where $\Psi$ represents a constant of proportionality.

Reference oscillator 276 provides reference signal 278 to a downstream multiplier 280 and an upstream multiplier 282. Downstream multiplier 280 multiplies the frequency of reference signal 278 by a predetermined number (n) to produce downstream LO signal 242, having a frequency $f_{dLO} = nf_r$. Multiplier 280 provides downstream LO signal 242 to mixer 252. Similarly, upstream multiplier 282 multiplies reference signal 278 by a different predetermined number (k) to produce upstream LO signal 244, having a frequency $f_{uLO} = kf_r$. Multiplier 282 provides upstream LO signal 244 to USP 232. Frequencies $f_{uLO}$ and $f_{dLO}$ represent, for example, linearly scaled versions of frequency $f_r$.

DSP 230, LO 234, and processor 272 operate together as a frequency-locked loop (FLL), including: mixer 252, filter 254, mixer 260, and filter 270 of DSP 232; processor 272; and oscillator 276 and multiplier 280 of LO 234. The FLL frequency-locks reference oscillator 276 (that is, frequency $f_r$ of reference signal 278) to frequency $f_{Ifd}$ of IF signal 224, and thus, to frequency $f_{RFd}$ of downstream signal 108, at least to the extent mixer 260 removes frequency offset $\Delta f_d$ from IF signal 258. The reason the FLL frequency-locks frequency $f_r$ to frequency $f_{IFd}$ and not to frequency $f_{IFd} + \Delta f_d$, is that frequency control signal 274 derives from a signal (namely, corrected downstream signal 110) substantially free of frequency offset $\Delta f_d$. The act of frequency-locking reference oscillator 276 to downstream frequency $f_{RFd}$ of downstream signal 108 (in the above-described manner) can be considered extracting inherent timing and/or frequency information from downstream signal 108.

In practice, reference oscillator 276 generates reference signal 278 at frequency $f_r$, such that frequency $f_r$ tends to include an inherent frequency error term $\Delta f_r$ arising from imperfections in the reference oscillator. In frequency-locking frequency $f_r$ to frequency $f_{IFd}$, the FLL reduces frequency error term $\Delta f_r$ to a sufficiently small value as to not adversely affect subsequent downstream processes (not shown) using corrected downstream signal 110.

DIFFERENCER

Differencer 236 includes a mixer 284 followed by a bandpass filter 286. Mixer 284 subtracts (that is, differences) the frequencies of upstream and downstream signals 244 and 242 to produce a difference signal 288. Bandpass filter 286 filters difference signal 288 to produce a filtered version thereof, namely, difference signal 246, mentioned above. Difference signal 246 has a frequency $\Delta f_{LO} = |f_{uLO} - f_{dLO}| = |(n-k)f_r|$.

When corrected downstream signal 110 is free of frequency offset $\Delta f_d$, differencer 236 produces difference signal 246 at a nominal predetermined difference frequency $\alpha$ based on the nominal predetermined frequency of frequency $f_r$. On the other hand, when corrected downstream signal 110 includes a residual portion of frequency offset $\Delta f_d$, difference frequency $\Delta f_{LO}$ is frequency-shifted from the nominal predetermined difference frequency $\alpha$ by an amount $|(n-k)|\Psi \Delta f_d$ representative of the residual portion of frequency offset $\Delta f_d$ corrupting frequency $f_r$. Therefore, difference signal 246 is indicative of the nominal predetermined frequency $\alpha$ and a frequency error term representative of (for example, proportional to) the residual portion of frequency offset $\Delta f_d$ corrupting corrected downstream signal 110.

Differencer 236 alone, or in combination with LO 234, can be considered generally as a circuit that generates a signal, generally referred to as an estimator signal, indicative of the residual portion of frequency offset $\Delta f_d$ corrupting corrected downstream signal 110. The estimator signal (for example, difference signal 246 in the embodiment of FIG. 2) is derived from corrected downstream signal 110, and therefore, can change over time to accurately reflect any corresponding change in the portion of the frequency offset $\Delta f_d$ corrupting corrected downstream signal 110. It is to be understood that the present invention is not limited to the use of differencer 236 (and LO 234) to derive the estimator signal, and that other circuits can be used to derive/generate the estimator signal, as would be apparent to one of ordinary skill in the relevant art after having read the description of the present invention.

ESTIMATOR

Differencer 236 provides difference signal 246 to estimator 240. Estimator 240 includes, connected in series, a frequency detector 290, a combiner 292, and a loop filter/integrator 294. Frequency detector 290 receives difference signal 246, and a reference signal 296 from reference signal generator 238. Reference signal 296 represents a reference frequency $f_{TRC}$ or standard against which frequency detector 290 can derive frequency measurements. Frequency detector 290 detects/measures the frequency of difference signal 246, and provides a detected frequency 298 to combiner 292. Detected frequency 298 represents the predetermined nominal difference frequency α together with the frequency error term (that is, |(n−k)|Ψ$\Delta f_d$) included in difference signal 246, both mentioned above.

Combiner 292 receives detected frequency 298 and a reference signal 320 indicative of the frequency value α (from a source not shown). Combiner 292 subtracts the frequency value α from detected frequency 298, to produce a residual signal 322 indicative of the frequency error term included in difference signal 246, and thus, indicative of the portion of frequency offset $\Delta f_d$ included in corrected downstream signal 110.

Combiner 292 provides residual signal 322 to loop filter 294. Loop filter 294 integrates residual signal 322 into frequency-offset estimate $\Delta e_d$, whereby the frequency-offset estimate is continuously, adaptively updated over time. Estimator 240, DSP 230, processor 272, LO 234, and differencer 236, operate together, in the manner described above, as an adaptive frequency-offset estimating loop. When frequency-offset estimate $\Delta e_d$ is too high or too low with respect to frequency offset $\Delta f_d$, the frequency-offset estimating loop respectively reduces or increases the frequency-offset estimate. When frequency-offset estimate $\Delta e_d$ accurately reflects frequency offset $\Delta f_d$, the frequency-offset estimating loop maintains the present value of the frequency-offset estimate $\Delta e_d$.

In device 200, free-running frequency offset $\Delta f_d$ from free-running oscillator 208, and frequency error $\Delta f_r$ from oscillator 276, represent two unknown (and undesired) variables or quantities. Essentially, the FLL and frequency-offset estimating loop of the present invention operate together to resolve the two unknown quantities such that frequency errors resulting from the unknowns can be substantially reduced. This means that given arbitrary initial conditions for the above mentioned unknown quantities, the FLL and frequency-offset estimating loop operate together to cause frequency errors arising from the unknowns to converge to a correct (or rather acceptable) and stable operating condition.

Upstream Signal Processor

USP 232 includes a baseband filter 324, a first mixer 326 following the filter, and an upstream correction signal generator 328. Upstream correction signal generator 328 is similar to downstream correction signal generator 262. Upstream correction signal generator 328 receives frequency offset estimate $\Delta e_d$ and a reference signal 330. In response to these input signals, correction signal generator 328 produces an upstream correction signal 331 having a frequency representative of frequency-offset estimate $\Delta e_d$ (for example, in the same way upstream correction signal 267 is representative of frequency-offset estimate $\Delta e_d$). In an alternative arrangement of the present invention, downstream and upstream signal generators 262 and 328 are the same signal generator, and correction signals 267 and 331 are the same signal.

Upstream baseband filter 324 provides a filtered, initial upstream signal 332 to mixer 326. Mixer 326 frequency-converts signal 332 to a first IF signal 333 based on upstream correction signal 331. Mixer 326 adds to upstream signal 332 the portion of the frequency offset $\Delta f_d$ represented by estimate $\Delta e_d$. That is, mixer 326 adds frequency offset $\Delta f_d$ to upstream correction signal 332 to the extent the frequency of upstream correction signal 331 represents frequency offset $\Delta f_d$. Mixer 326 provides first IF signal 333 to an IF bandpass filter 334. In an arrangement of the present invention, signals 112, 332, and 331 are digital signals, and a digital-to-analog (D/A) converter is connected between mixer 326 and filter 334 to converts a digital IF signal output by mixer 326 to an analog IF signal. In this arrangement, IF signal 333 supplied to filter 334 is an analog signal.

IF BPF 334 provides a filtered, first IF signal 336 to a second upstream mixer 338 of USP 232. Mixer 338 frequency-converts first IF signal 336 to pre-corrected upstream signal 226 based on upstream LO signal 244. Pre-corrected upstream signal 226 also includes the portion of the frequency offset $\Delta f_d$ represented by estimate $\Delta e_d$. Mixer 338 provides pre-corrected signal 226 to upstream frequency-converter 206 of front-end device 202.

Mixer 216 cancels frequency offset $\Delta f_d$ in LO signal 220 with the frequency-offset included in pre-corrected upstream signal 226 to the extent the two frequency offsets are equal to one another. Therefore, mixer 216 produces upstream signal 114 at a frequency (frequency $f_{RFu}$) substantially free of frequency offset $\Delta f_d$. Since the present invention (1) frequency-converts initial upstream signal 112 using an upstream LO signal (for example, LO signal 244) that is frequency-locked to downstream signal 108, and (2) substantially prevents free-running frequency offset $\Delta f_d$ from contaminating upstream signal 114, the present invention can be considered to generate an upstream signal (that is, signal 114) that includes inherent frequency and/or timing information matched closely to the frequency and/or timing characteristics of downstream signal 108.

Alternative arrangements of USP 232 are within the scope of the present invention. For example, USP 232 may include only a single mixer to frequency up-convert initial upstream signal 112. In an alternative embodiment of the back-end device, USP 232 is omitted. In such an embodiment, the back-end device processes only downstream signals.

REFERENCE SIGNAL GENERATOR

Figure 3:
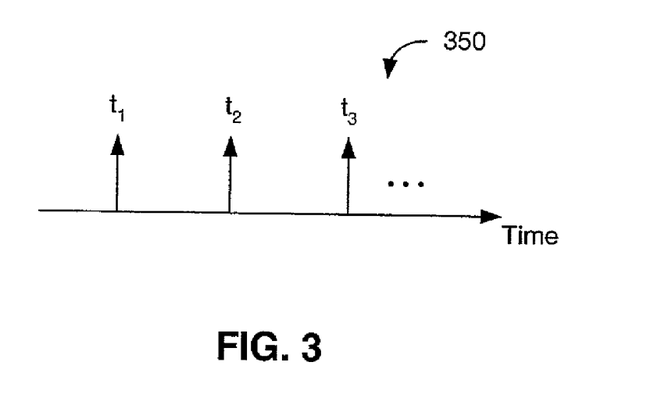
FIG. 3 is a timing diagram of an example portion of a downstream signal encoded with a master timing signal.

As discussed above in connection with FIG. 1, transceiver 102 may encode downstream signal 108 with a master timing signal, including, for example, a series of temporally spaced time stamps. FIG. 3 is a timing diagram of an example portion 350 of a downstream signal encoded with periodic time-stamps $t_1$, $t_2$, $t_3$, and so on. The present invention can take advantage of the encoded master timing signal included in downstream signal 108 to derive an accurate frequency standard (reference signal 296) against which frequency detector 290 can derive frequency measurements, as is now described.

Figure 4:
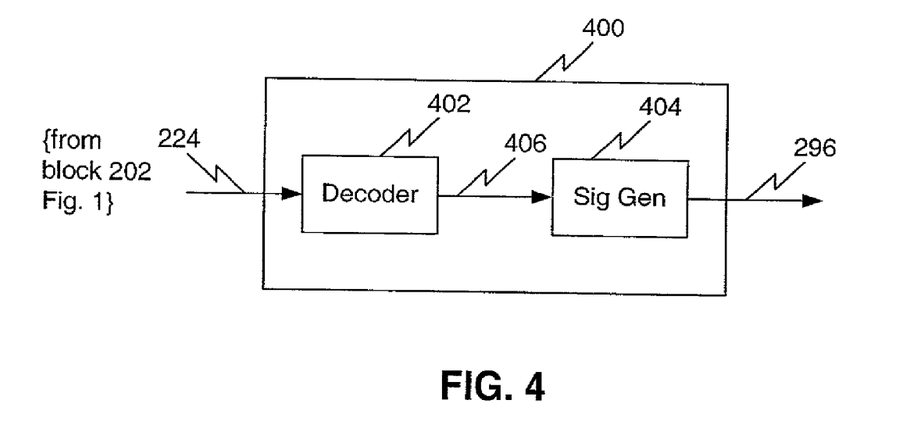
FIG. 4 is a block diagram of an example reference signal generator for deriving a reference signal from an encoded master timing signal.

FIG. 4 is a block diagram of a reference signal generator 400 for deriving reference signal 296 from the above-mentioned encoded master timing signal. Reference signal generator 400 is an alternative embodiment of reference signal generator 238 used in back-end device 204. Reference signal generator 400 receives initial downstream signal 224. When downstream signal 108 includes the encoded master timing signal, downstream signal 224 also includes the encoded master timing signal, since downstream signal 224 is a frequency-translated version of received downstream signal 108. In an alternative arrangement, the reference signal generator can receive downstream signal 108 directly, or alternatively, IF signal 256, and so on.

Reference signal generator 400 includes a decoder 402 coupled to a signal generator 404. The decoder 402 decodes the encoded master timing signal included in signal 224, to recover the time stamps of the master timing signal. Decoder 402 derives a frequency control signal 406 from the time stamps. In response to frequency control signal 406 (that is, the recovered time stamps), generator 404 generates reference signal 296 such that reference signal 296 accurately represents a reference frequency of (that is, a frequency standard established at) transceiver 102.

Example Frequencies

Table 1 below includes a list of signal frequencies used in exemplary arrangements of environment 100 and transceiver 200.

TABLE 1

| frequency designator, or signal designator, from FIG. 1. | Nominal, predetermined frequency (MHz) (i.e., without frequency offset/error) |
|---|---|
| $f_{RFu}$ | 2500 |
| $f_{RFd}$ | 2596 |
| $f_{LO}$ | 2170 |
| $f_{IFu}$ ($f_{RFu} - f_{LO}$) | 2500 − 2170 = 330 |
| $f_{IFd}$ ($f_{RFu} - f_{LO}$) | 2596 − 2170 = 426 |
| $f_r$ | 24 |
| $f_{uLO}$ (= $kf_r$) | 336 (k = 14) |
| $f_{dLO}$ (= $nf_r$) | 432 (n = 18) |
| $\Delta f_{LO}$ | 96 (= α) |
| downstream IF signals 256, 258 | 6 ($f_r/4$) |
| upstream IF signals 333, 336 | 6 ($f_r/4$) |
| reference signals 266, 330 | 6 ($f_r/4$) |

Method Flow Charts

In describing various methods below, references are made to signals and/or elements depicted in FIGS. 1–4 for exemplary purposes only. Such references are not intended to limit the methods to particular embodiments of the present invention described above.

Figure 5:
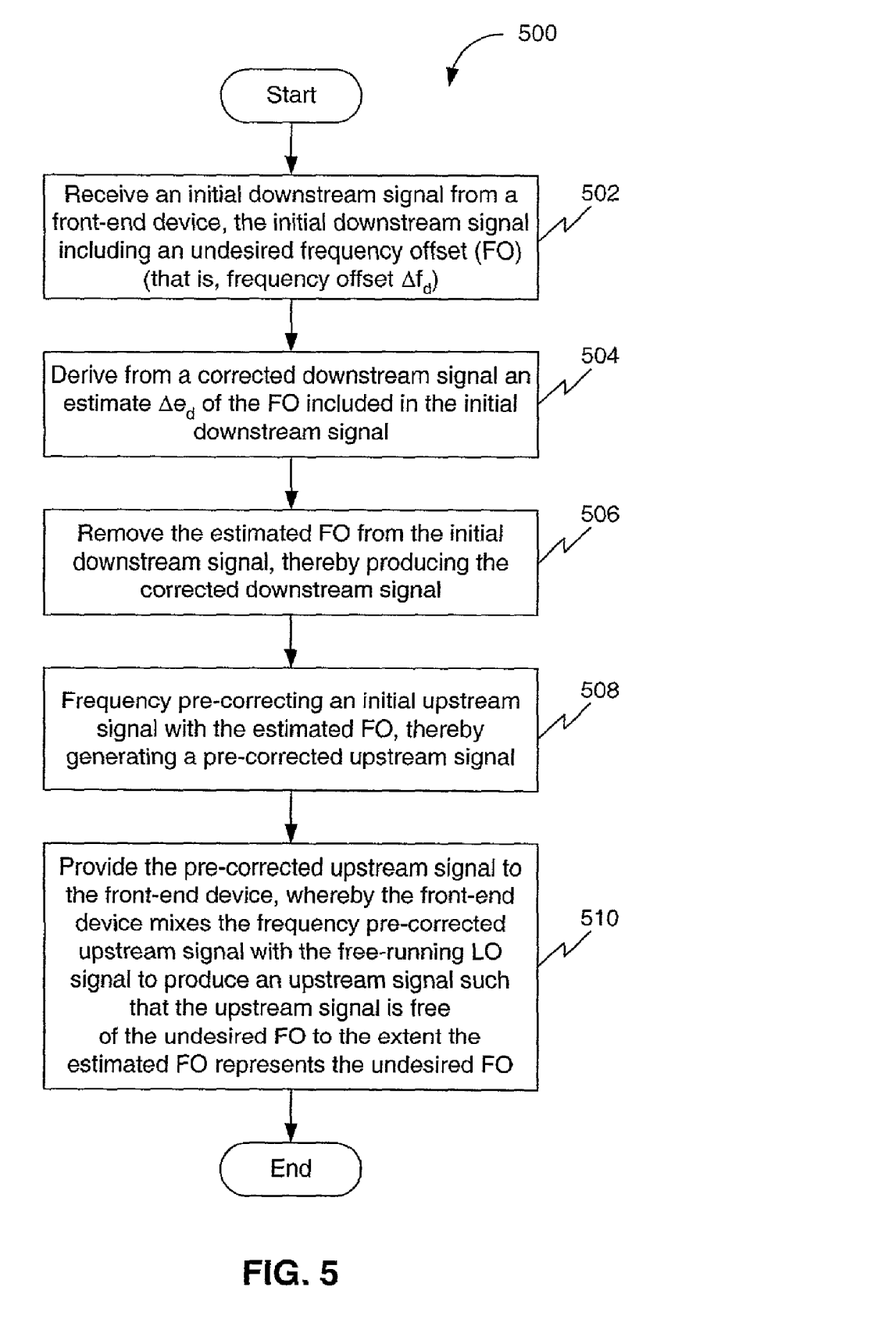
FIG. 5 is a flow chart of an example method of compensating for a frequency offset from a free-running oscillator in an upstream and a downstream direction.

FIG. 5 is a flow chart of an example method 500 of compensating for a frequency offset from a free-running oscillator in an upstream and a downstream direction. Method 500 is implemented, for example, in back-end device 204, and assumes back-end device 204 operates with front-end device 202. Method 500 corresponds to the present invention operating in a steady-state condition, after mixer 260 has initially removed a frequency offset from IF signals 256/258 to produce corrected signal 110, based on an initial, arbitrary value of frequency-offset estimate $\Delta e_d$. Front-end device 202 receives downstream signal 108 and transmits upstream signal 114. Front-end device 202 mixes downstream signal 108 with free-running LO signal 218 including undesired frequency offset $\Delta f_d$, and thereby produces initial downstream signal 224 also including frequency offset $\Delta f_d$.

In a first step 502 of method 500, back-end device 204 receives initial downstream signal 224 including undesired frequency offset $\Delta f_d$ (also referred to below as the undesired frequency offset (FO)).

In a next step 504, DSP 230, processor 272, LO 234, differencer 236, and estimator 240, operate together to derive from corrected downstream signal 110 (available in the steady-state condition), frequency-offset estimate $\Delta e_d$ indicative of frequency offset $\Delta f_d$ included in initial downstream signal 224.

In a next step 506, DSP 230 removes the estimated frequency offset $\Delta e_d$ from initial downstream signal 224, thereby producing corrected downstream signal 110. In doing so, DSP 230 also frequency-converts initial downstream signal 224 to a baseband frequency. Steps 504 and 506 together comprise adaptively estimating frequency offset $\Delta f_d$.

In a next step 508, USP 232 frequency pre-corrects initial upstream signal 112 using the estimated frequency offset $\Delta e_d$, thereby generating pre-corrected upstream signal 226. In doing so, USP 232 also frequency-converts initial upstream signal 112 from a baseband frequency to an IF frequency (of upstream signal 226).

In a next step 510, back-end device 204 provides pre-corrected upstream signal 226 to front-end device 202, whereby the front-end device mixes frequency pre-corrected upstream signal 226 with free-running LO signal 220 to produce upstream signal 114 such that the upstream signal is free of the undesired FO (that is, frequency offset $\Delta f_d$) to the extent the estimated FO represents the undesired FO. Method 500 repeats over time.

Method 500 can be modified to a method of compensating for a frequency offset from a free-running oscillator in only a downstream direction by omitting method steps 508 and 510.

Figure 6:
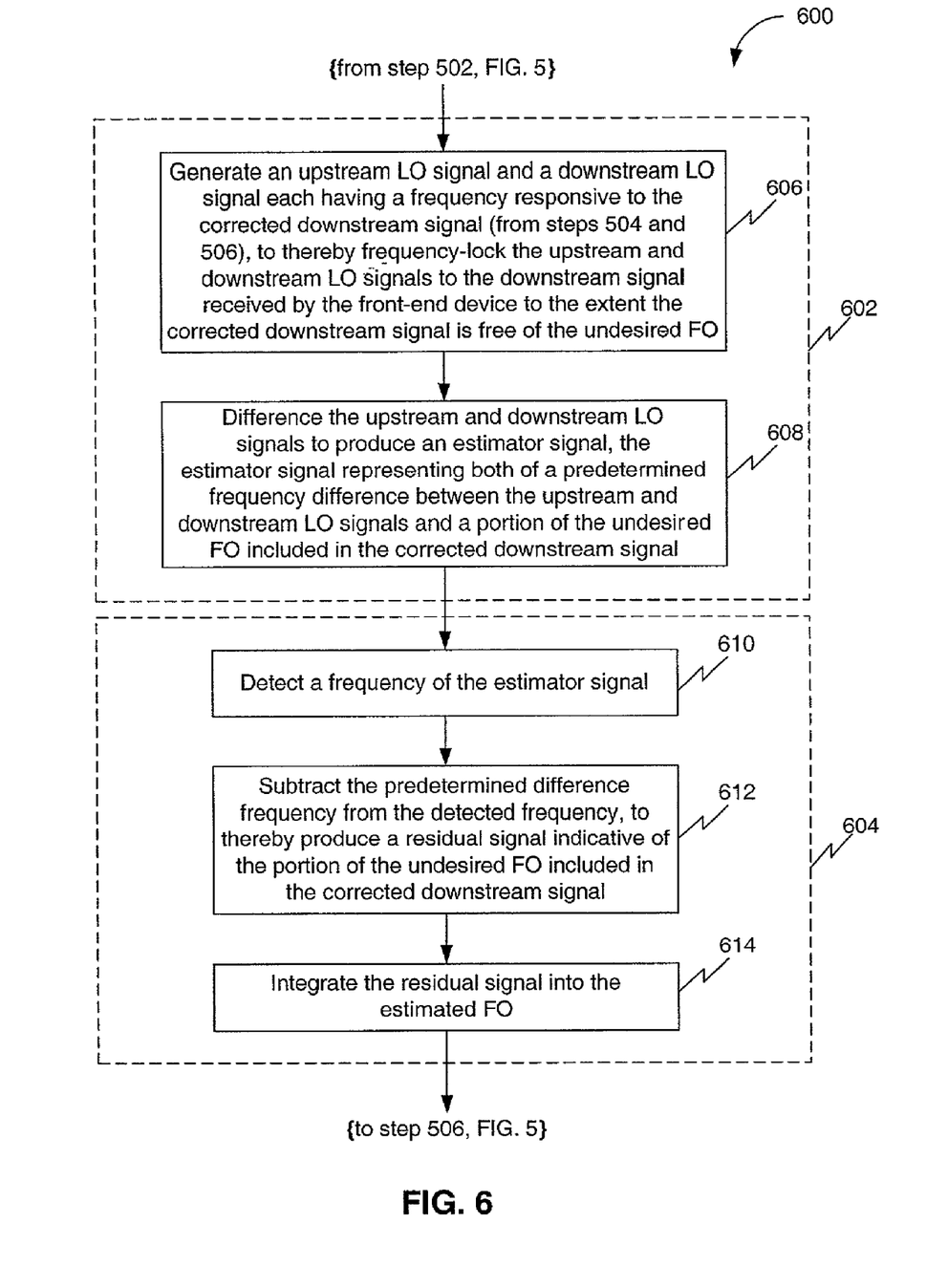
FIG. 6 is a flow chart of an example method of deriving a frequency offset estimate, expanding on the method of FIG. 5.

FIG. 6 is a flow chart of an example method 600 of deriving the frequency-offset estimate $\Delta e_d$ (also referred to as estimated frequency offset $\Delta e_d$). Method 600 expands on method step 504, described above. Method 600 includes high-level steps 602 and 604 (indicated by dashed lines in FIG. 6). In step 602, LO 234 and differencer 236 operate together to generate estimator signal 246 indicative of the portion of the undesired $\Delta f_d$ included in corrected downstream signal 110.

In a first sub-step 606 of step 602, LO 234 generates upstream LO signal 244 and downstream LO signal 242 each having a frequency responsive to corrected downstream signal 110. This frequency-locks upstream and downstream LO signals 244, 242 to downstream signal 108 received by front-end device 202 to the extent corrected downstream signal 110 is free of undesired frequency offset $\Delta f_d$. In a next sub-step 608 of step 602, differencer 236 differences the upstream and downstream LO signals 242, 244 to produce estimator signal 246.

In next high-level step 604, estimator 240 estimates frequency offset $\Delta f_d$, to produce frequency-offset estimate $\Delta e_d$. In a first sub-step 610 of step 604, detector 290 detects the frequency of estimator signal 246. In a next sub-step 612, combiner 292 subtracts the predetermined difference frequency α from the detected frequency 298, thereby producing a residual signal 322 indicative of the portion of the undesired $\Delta f_d$ contaminating corrected downstream signal 110. In a next sub-step 614, integrator 294 integrates residual signal 322 into the frequency offset estimate $\Delta e_d$.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. In a communication back-end device adapted to operate with a front-end device, the front-end device receiving a downstream signal and transmitting an upstream signal, the front-end device mixing the downstream signal with a free-running LO signal including a frequency offset (FO), thereby producing an initial downstream signal including the FO, a method of compensating for the FO, comprising:
   (a) receiving the initial downstream signal including the undesired FO, wherein the initial downstream signal includes a master timing signal;
   (b) deriving from a corrected downstream signal an estimate of the FO included in the initial downstream signal based on a reference frequency derived from the master timing signal and an estimator signal indicative of a portion of the undesired FO included in the corrected downstream signal;
   (c) removing the estimated FO from the initial downstream signal, thereby producing the corrected downstream signal;
   (d) frequency pre-correcting an initial upstream signal with the estimated FO, thereby generating a pre-corrected upstream signal; and
   (e) providing the pre-corrected upstream signal to the front-end device, whereby the front-end device mixes the frequency pre-corrected upstream signal with the free-running LO signal to produce the upstream signal such that the upstream signal is free of the undesired FO to the extent the estimated FO represents the undesired FO.

2. The method of claim 1, further comprising:
generating an upstream correction signal representative of the estimated FO,
wherein step (d) comprises frequency-converting the initial upstream signal to the pre-corrected upstream signal using the upstream correction signal.

3. The method of claim 2, further comprising:
generating an upstream LO signal having a frequency responsive to the corrected downstream signal, thereby frequency-locking the upstream LO signal to the downstream signal received by the front-end device to the extent the corrected downstream signal is free of the undesired FO,
wherein step (d) comprises frequency-converting the initial upstream signal to the pre-corrected upstream signal using the upstream correction signal and the upstream LO signal.

4. The method of claim 1, further comprising:
generating a downstream correction signal representative of the estimated FO,
wherein step (c) comprises frequency-converting the initial downstream signal from the front-end device using the downstream correction signal.

5. The method of claim 4, further comprising:
generating a downstream LO signal having a frequency responsive to the corrected downstream signal, thereby frequency-locking the downstream LO signal to the downstream signal received by the front-end device to the extent the corrected downstream signal is free of the undesired FO; and
frequency-converting the initial downstream signal from the front-end device to an IF downstream signal using the downstream LO signal,
wherein step (c) comprises frequency-converting the IF downstream signal to the corrected downstream signal using the correction signal.

6. In a communication back-end device adapted to operate with a front-end device, the front-end device receiving a downstream signal and mixing the downstream signal with a free-running LO signal including an undesired frequency offset (FO), thereby producing an initial downstream signal including the undesired FO, a method of compensating for the FO, composing:
   (a) receiving the initial downstream signal including the undesired FO;
   (b) deriving from a corrected downstream signal an estimate of the FO included in the initial downstream signal;
   (c) frequency-converting the initial downstream signal from the front-end device to an IF downstream signal using a downstream LO signal having a frequency responsive to the corrected downstream signal; and
   (d) frequency-converting the IF downstream signal using a downstream correction signal representative of the estimated FO to generate the corrected downstream signal.

7. The method of claim 6, wherein step (b) comprises:
generating an estimator signal indicative of a portion of the undesired FO included in the corrected downstream signal; and
estimating the FO based on the estimator signal.

8. The method of claim 7, wherein the downstream signal received by the front-end device includes a master timing signal, and step, (b) further comprises:
deriving a reference frequency from the master timing signal; and
estimating the FO based on the estimator signal and the reference frequency.

9. The method of claim 7, wherein said step of generating the estimator signal comprises:
generating a first LO signal and a second LO signal each having a frequency responsive to the corrected downstream signal, thereby frequency-locking the first and second LO signals to the downstream signal received by the front-end device to the extent the corrected downstream signal is free of the undesired FO; and
differencing the first and second LO signals to produce the estimator signal, the estimator signal representing both of
a predetermined frequency difference between the first and second LO signals and
the portion of the undesired FO included in the corrected downstream signal.

10. The method of claim 9, wherein said step of estimating the FO comprises:
detecting a frequency of the estimator signal;
subtracting the predetermined frequency difference from the detected frequency, thereby producing a residual signal indicative of the portion of the undesired FO contaminating the corrected downstream signal; and
integrating the residual signal into the estimated FO.

11. In a communication back-end device adapted to operate with a front-end device, the front-end device receiving a downstream signal and transmitting an upstream signal, the front-end device mixing the downstream signal with a free-running LO signal including a frequency offset (FO), thereby producing an initial downstream signal including the FO, a method of compensating for the FO, comprising:
  (a) receiving the initial downstream signal including the undesired FO;
  (b) adaptively estimating the FO included in the initial downstream signal;
  (c) removing the estimated FO from the initial downstream signal, thereby producing the corrected downstream signal;
  (d) frequency-converting the initial upstream signal based on an upstream correction signal representative of the estimated FO and an upstream LO signal having a frequency responsive to the corrected downstream signal to generate a pre-corrected upstream signal; and
  (e) providing the pre-corrected upstream signal to the front-end device, whereby the front-end device mixes the frequency pre-corrected upstream signal with the free-running LO signal to produce the upstream signal such that the upstream signal is free of the undesired FO to the extent the estimated FO represents the undesired FO.

12. The method of claim 11, wherein step (b) comprises estimating the FO included in the initial downstream signal based on the corrected downstream signal.

13. A communication back-end device adapted to operate with a front-end device, the front-end device receiving a downstream signal and transmitting an upstream signal, the front-end device mixing the downstream signal with a free-running Local Oscillator (LO) signal including a frequency offset (FO), thereby producing an initial downstream signal including the FO, comprising:
  an estimator adapted to estimate the FO based on a corrected downstream signal;
  a downstream signal processor adapted to remove the estimated FO from the initial downstream signal to produce the corrected downstream signal;
  an LO adapted to generate an upstream LO signal having a frequency responsive to the corrected downstream signal and thereby frequency-locked to the downstream signal received by the front-end device to the extent the corrected downstream signal is free of the undesired FO; and
  an upstream signal processor adapted to frequency pre-correct an initial upstream signal with the estimated FO, thereby generating a pre-corrected upstream signal, the upstream signal processor being adapted to provide the pre-corrected upstream signal to the front-end device, whereby the front-end device mixes the frequency pre-corrected upstream signal with the free-running LO signal to produce the upstream signal such that the upstream signal is free of the undesired FO to the extent the estimated FO represents the undesired FO, wherein the upstream signal processor further includes:
    an upstream correction signal generator adapted to generate an upstream correction signal representative of the estimated FO,
    a first frequency-converter adapted to frequency-convert the initial upstream signal to an upstream IF signal using the upstream correction signal, and
    a second frequency-converter adapted to frequency-convert the upstream IF signal to the pre-corrected upstream signal using the upstream LO signal.

14. The device of claim 13, further comprising:
  a circuit adapted to generate an estimator signal indicative of a portion of the undesired FO included in the corrected downstream signal,
  wherein the estimator is adapted to estimate the FO based on the estimator signal.

15. The device of claim 14, wherein the downstream signal received by the front-end device includes a master timing signal, the device further comprising:
  a reference signal generator adapted to derive a reference frequency from the master timing signal, the estimator being adapted to estimate the FO based on the estimator signal and the reference frequency.

16. The device of claim 14, further comprising:
  an LO adapted to generate an upstream LO signal and a downstream LO signal each having a frequency responsive to the corrected downstream signal and thereby frequency-locked to the downstream signal received by the front-end device to the extent the corrected downstream signal is free of the undesired FO,
  wherein the circuit includes a signal differencer adapted to generate the estimator signal based on the upstream and downstream LO signals, the estimator signal representing both
  a predetermined frequency difference between the upstream and downstream LO signals and
  the portion of the undesired FO contaminating the corrected downstream signal.

17. The device of claim 16, wherein the estimator comprises:
  a frequency detector adapted to detect a frequency of the estimator signal;
  a subtractor adapted to subtract the predetermined frequency difference from the detected frequency, thereby producing a residual signal indicative of the portion of the undesired FO contaminating the corrected downstream signal; and
  an integrator adapted to integrate the residual signal into the estimated FO.

18. A communication back-end device adapted to operate with a front-end device, the front-end device receiving a downstream signal and mixing the downstream signal with a free-running LO signal including an undesired frequency offset (FO), thereby producing an initial downstream signal including the undesired FO, the back-end device comprising:
  an estimator adapted to estimate the FO based on a corrected downstream signal;
  an LO adapted to generate a downstream LO signal having a frequency responsive to the corrected downstream signal and thereby frequency-locked to the downstream signal received by the front-end device to the extent the corrected downstream signal is free of the undesired FO; and
  a downstream signal processor adapted to remove the estimated FO from the initial downstream signal to produce the corrected downstream signal, wherein the downstream signal processor further includes:
    a downstream correction signal generator adapted to generate a downstream correction signal representative of the estimated FO,
    a first frequency-converter adapted to frequency-convert the initial downstream signal from the front-end device to a downstream IF signal using the downstream LO signal, and a second frequency-converter adapted to frequency-convert the downstream IF signal to the corrected downstream signal using the downstream correction signal.

19. The device of claim 18, further comprising:

a circuit adapted to generate an estimator signal indicative of a portion of the undesired FO included in the corrected downstream signal, the estimator being adapted to estimate the FO based on the estimator signal.

20. The device of claim 19, wherein the downstream signal received by the front-end device includes a master timing signal, the device further composing:

a reference signal generator adapted to derive a reference frequency from the master timing signal, the estimator being adapted to estimate the FO based on the estimator signal and the reference frequency.

21. The device of claim 19, further comprising:

an LO adapted to generate a first LO signal and a second LO signal each having a frequency responsive to the corrected downstream signal and thereby frequency-locked to the downstream signal received by the front-end device to the extent the corrected downstream signal is free of the undesired FO, wherein the circuit includes a signal differencer adapted to generate the estimator signal based on the first and second LO signals, the estimator signal representing both a predetermined frequency difference between the first and second LO signals and the portion of the undesired FO contaminating the corrected downstream signal.

22. The device of claim 21, wherein the estimator comprises: a frequency detector adapted to detect a frequency of the estimator signal;

a subtractor adapted to subtract the predetermined frequency difference from the detected frequency, thereby producing a residual signal indicative of the portion of the undesired FO contaminating the corrected downstream signal; and an integrator adapted to integrate the residual signal into the estimated FO.

23. In a communication back-end device adapted to operate with a front-end device, the front-end device receiving a downstream signal and transmitting an upstream signal, the downstream signal received by the front-end device includes a master timing signal, the front-end device mixing the downstream signal with a free-running LO signal including a frequency offset (FO), thereby producing an initial downstream signal including the FO, a method of compensating for the FO; comprising:

(a) receiving the initial downstream signal including the undesired FO;

(b) deriving from a corrected downstream signal an estimate of the FO included in the initial downstream based on an estimator signal, wherein generating an estimator signal includes:

(i) generating an upstream LO signal and a downstream LO signal each having a frequency responsive to the corrected downstream signal, thereby frequency-locking the upstream and downstream LO signals to the downstream signal received by the front-end device to the extent the corrected downstream signal is free of the undesired FO; and (ii) differencing the upstream and downstream LO signals to produce the estimator signal, the estimator signal representing both of a predetermined frequency difference between the upstream and downstream signals and the portion of the undesired FO included in the corrected downstream signal, (c) deriving from a corrected downstream signal an estimate of the FO included in the initial downstream signal;

(d) removing the estimated FO from the initial downstream signal, thereby producing the corrected downstream signal;

(e) frequency pre-correcting an initial upstream signal with the estimated FO, thereby generating a pre-corrected upstream signal; and (f) providing the pre-corrected upstream signal to the front-end device, whereby the front-end device mixes the frequency pre-corrected upstream signal with the free-running LO signal to produce the upstream signal such that the upstream signal is free of the undesired FO to the extent the estimated FO represents the undesired FO.

24. The method of claim 23, wherein said step of estimating the FO comprises:

detecting a frequency of the estimator signal;

subtracting the predetermined difference frequency from the detected frequency, thereby producing a residual signal indicative of the portion of the undesired FO contaminating the corrected downstream signal; and integrating the residual signal into the estimated FO.

\* \* \* \* \*

UNITED STATES PATENT AND TRADEMARK OFFICE
CERTIFICATE OF CORRECTION

PATENT NO. : 7,155,174 B2 Page 1 of 1
APPLICATION NO. : 09/978719
DATED : December 26, 2006
INVENTOR(S) : Mark Dale It is certified that error appears in the above-identified patent and that said Letters Patent is hereby corrected as shown below:

- In Claim 6 Column 12, line 16, "composing:" should be replaced with --comprising:--.
- In Claim 20 Column 15, line 13 "composing:" should be replaced with --comprising:--.

Signed and Sealed this

Twentieth Day of March, 2007

JON W. DUDAS
*Director of the United States Patent and Trademark Office*